United States Patent [19]

Janta et al.

[11] Patent Number: 4,560,942
[45] Date of Patent: Dec. 24, 1985

[54] DEMODULATION CIRCUIT HAVING TRIANGULAR WAVE FOR BLOCKING HARMONICS

[75] Inventors: Dieter Janta; Wolfgang Nolde, both of Hamburg, Fed. Rep. of Germany

[73] Assignee: U.S. Philips Corporation, New York, N.Y.

[21] Appl. No.: 720,042

[22] Filed: Apr. 3, 1985

Related U.S. Application Data

[63] Continuation of Ser. No. 361,999, Mar. 25, 1982, abandoned.

[30] Foreign Application Priority Data

Apr. 11, 1981 [DE] Fed. Rep. of Germany ....... 3114761

[51] Int. Cl.$^4$ ............................................. H03D 1/04
[52] U.S. Cl. .................................... 329/101; 329/50; 381/7
[58] Field of Search ................. 329/50, 101, 122, 167; 381/1, 2, 3, 4, 5, 7, 15, 20; 358/19; 331/111

[56] References Cited

U.S. PATENT DOCUMENTS 3,831,113  8/1974  Ahmed .................................. 331/111
4,054,839 10/1977  Ohsawa .......................... 329/122 X Primary Examiner—Eugene R. Laroche
Assistant Examiner—Robert J. Pascal
Attorney, Agent, or Firm—Thomas A. Briody; William J. Streeter; Marianne Rich

[57] ABSTRACT

A demodulator circuit for demodulating a signal which varies substantially sinusoidally with time, such as a stereo signal having a carrier frequency, comprises a mixer circuit having a first input with a linear transfer characteristic which receives the stereo multiplex signal $u_m$ to be demodulated and having a second input with a substantially hyperbolic tangent transfer characteristic, the second input receiving a signal $u_d$. The signal $u_d$ is a voltage having a triangular wave shape superimposed with the triangular wave shape having the carrier frequency. A stereo output signal L and R is produced having minimal third and fifth harmonics of the carrier frequency is produced from a matrix circuit as a result of the triangular shape and amplitude of the signal $u_d$.

8 Claims, 5 Drawing Figures

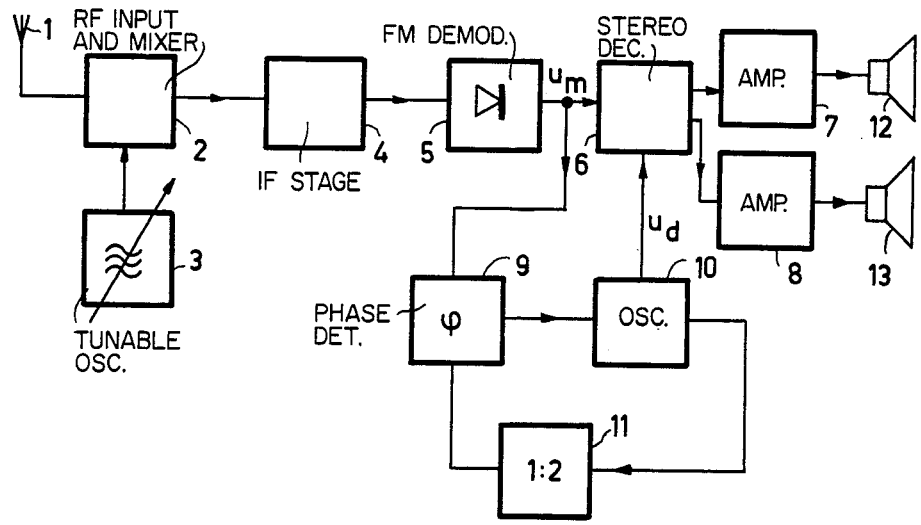
FIG.1
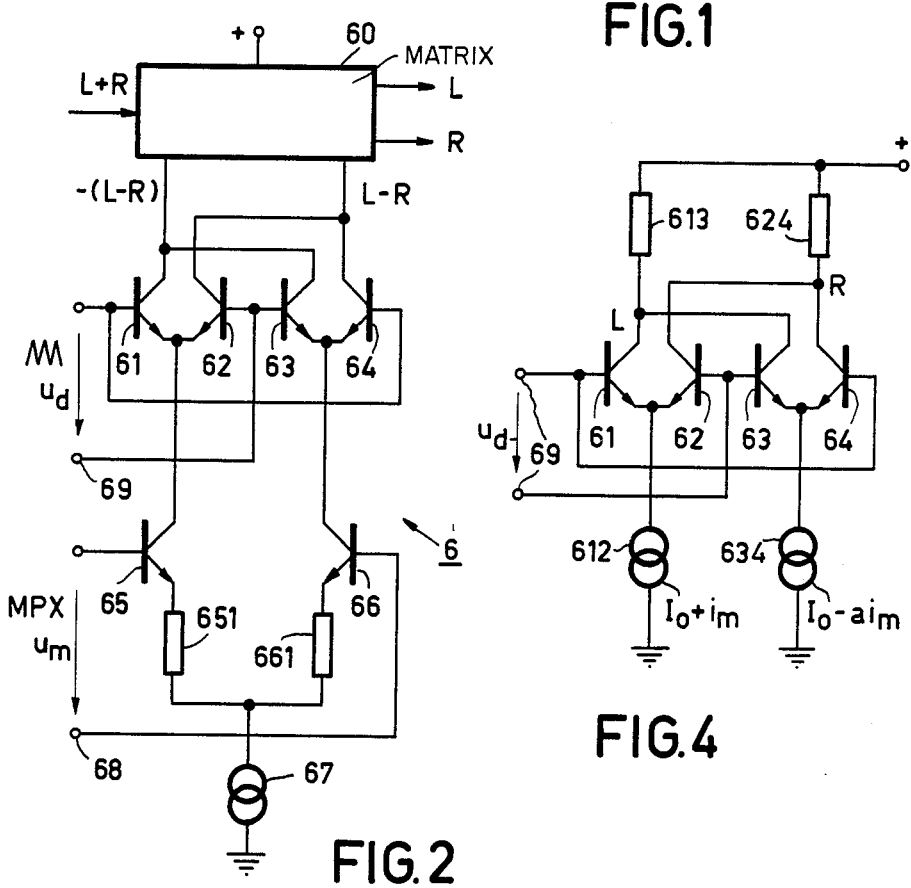
FIG.2
FIG.4

DEMODULATION CIRCUIT HAVING TRIANGULAR WAVE FOR BLOCKING HARMONICS

This is a continuation of application Ser. No. 361,999, filed Mar. 25, 1982, abandoned.

BACKGROUND OF THE INVENTION

The invention relates to a demodulator circuit for demodulating a signal which varies substantially sinusoidally with time, the demodulator circuit comprises a mixer circuit to which the first modulated signal to be demodulated is applied at a first input connected to circuitry creating a linear transfer function, which exhibits, and to which a second symmetrical signal having the frequency of the carrier of the first signal is applied at a second input to circuitry creating a transfer function having a hyperbolic tangent characteristic.

Here and in the further course of this description a mixer circuit is understood to mean a circuit which mixes two signals at the two inputs in such a manner that a signal having the difference frequency of the two input signals is produced at the output. This difference frequency may be equal to 0. Here, the word transfer function is depending variation of the output signal amplitude as a function of the amplitude of the signal at the relevant input, when the signal at the other input is kept constant. The fact that the mixer circuit has an input connected to circuitry creating a transfer function having a hyperbolic tangent characteristic means that between the output voltage $\underline{y}$ and the voltage $\underline{x}$ at that input (there being a constant signal at the other input) there is the following relationship:

$$y = a + b \tanh cx,$$

wherein a, b and c are constants.

A demodulator circuit of the above-described type is disclosed in U.S. Pat. No. 3,617,641, but that circuit such also comprises a mixer circuit as the stereo-multiplex signal applied to an input of the stereo decoder which incorporates a difference signal which is modulated on a (suppressed) 38 KHz carrier. This mixer circuit also has an input-output with a hyperbolic tangent transfer function to which a square-wave signal having a frequency of 38 kHz is applied, causing the signals for the left and right channels to be produced at the output of the mixer circuit. However, the frequency spectrum of this square-wave 38 kHz signal comprises odd harmonics, more specifically the third harmonic of the 38 kHz fundamental wave. This may result in a transmission in an adjacent channel affecting the output signals of the stereo decoder.

In order to avoid interferences of such a type by an adjacent channel transmission it is known from German Patent Application No. 25 13 228, which has been laid open to public inspection, to use instead of a square-wave signal a staircase signal which may assume three different voltage values depending on the phase position. This indeed prevents the occurrence of the third harmonic so that modulation products of the adjacent transmission (that is to say a transmitter transmitting at a 100 kHz spacing from the relevant received transmission) cannot be received. An substantial fifth harmonic (having a frequency of 190 kHz) is however produced, which results in modulation products of a transmission at a spacing of 200 kHz relative to the received transmission being possibly received.

It would be possible to also prevent this fifth harmonic from occurring by using a signal which changes step-wise with four voltage values as disclosed in German Patent Application No. 28 50 555 which has been laid open to public inspection, but this would cause the mixer circuit to be even more complicated and more expensive.

It is an object of the invention to provide a demodulator circuit which does not suffer to any great extent to the above harmonic difficulties.

SUMMARY OF THE INVENTION

The invention provides a demodulator circuit of the type described in the opening paragraph and which is characterized in that this second signal varies triangularly with time and has an amplitude such that the third and fifth harmonics of the carrier frequency at the output of the mixer circuit are reduced to at least a substantially minimum value.

The invention is based on the recognition of the fact that owing to the hyperbolic tangent second input-output transfer characteristic a voltage of appropriate amplitude which varies triangularly at that input is distorted to such an extent that (for a constant signal at the first input) a substantially sinusoidal signal is produced at the output of the mixer circuit. In other words: the non-linear characteristic of the second input does not cause generation of third and fifth harmonics and even suppresses these harmonics to a very large extent should these harmonics be present in the signal applied to the second input. Also even harmonics cannot be produced in the demodulator circuit in accordance with the invention, which supplies in a similar manner also to the prior art, above-mentioned circuit.

The demodulator circuit in accordance with the invention can be used for demodulating amplitude-modulated signals, particularly signals having a suppressed carrier, it being a condition that the frequency of the triangularly shaped signal applied to the second input corresponds to the carrier frequency. The amplitude-modulated signal itself must then be applied to the first input. This function of the demodulator circuit renders this circuit particularly suitable for use in stereo decoders.

The demodulator circuit in accordance with the invention may, however, also be used as a phase-demodulator or a phase detector circuit, more specifically in the phase locked loop (PLL) for generating the subcarrier frequency in a stereo decoder. Suchh a PLL comprises a voltage-controlled oscillator which generates a frequency of 38 kHz (or a multiple thereof) and which applies this frequency to the stereo decoder. Via a suitable frequency divider the oscillator frequency is reduced to 19 kHz and compared in a phase detector with the pilot signal contained in the stereo multiplex signal. The phase detector circuit generates a control signal with which the frequency of the voltage-controlled oscillator is synchronized with the 19 kHz pilot signal. However, when traffic information is transmitted, a 57 kHz signal (thrice 19 kHz) is furthermore transmitted which signal may also affect tuning of the oscillator, namely when the third harmonic is generated in the phase detector circuit from the signal derived from the oscillator. By using the demodulator circuit in accordance with the invention as a phase detection circuit faulty tuning may be avoided.

In a preferred embodiment of the invention the mixer circuit is formed by at least one pair of bipolar emitter-coupled transistors. A current source producing a current which corresponds to the signal to be demodulated is incorporated in the common emitter lead. The voltage which varies triangularly with time may then have an amplitude of between 60 mV and 150 mV and may be produced by a low-ohmic voltage source. This voltage is applied to the base of at least one of the two transistors of the pair (pairs) of the emitter-coupled transistors.

BRIEF DESCRIPTION OF THE DRAWINGS

The invention will now be described in greater detail by way of example with reference to the accompanying drawings in which:

FIG. 1 shows a receiver comprising a stereo decoder having a demodulator circuit in accordance with the invention, FIG. 2 shows a first embodiment of such a demodulator circuit, FIG. 4 shows a second embodiment of the demodulator circuit which serves as a stereo decoder.

DETAILED DESCRIPTION OF THE EMBODIMENTS

Figure 3:
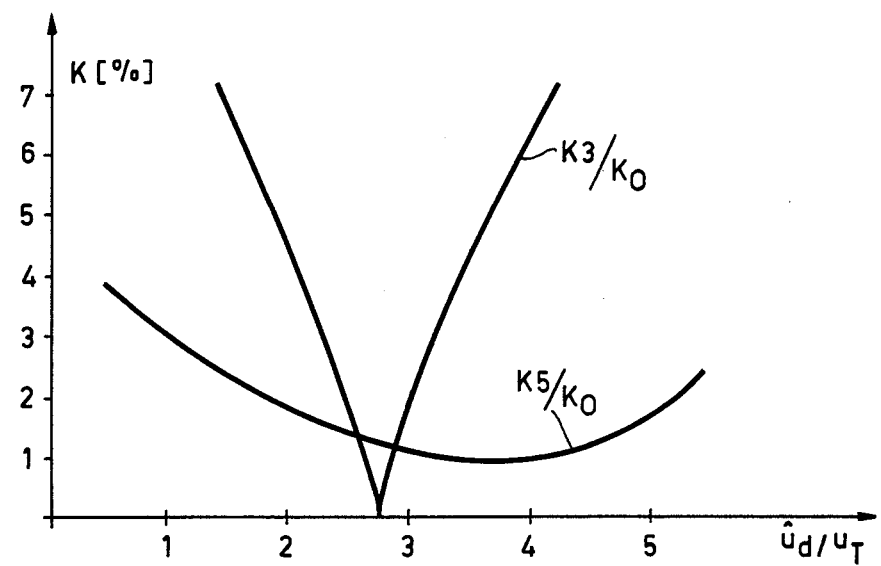
FIG. 3 shows the magnitude of the third and fifth harmonics as a function of the amplitude of the delta input signal in the circuit of FIG. 2.

In the receiver shown in FIG. 1 the signal supplied by an antenna 1 is processed by a RF-input and mixer stage 2 and converted to the IF range by means of a tunable oscillator 3 and applied at an IF-stage 4. The output signal of the IF-stage 4 is demodulated in a FM-demodulator 5. The output signal of the FM-demodulator 5, which in the case of stereo transmission is a stereo multiplex signal $u_m$ is applied to a stereo decoder 6 to whose two outputs two amplifiers 7 and 8 and loudspeakers 12 and 13, respectively are connected for the respective "left" and "right" channels.

In addition, the output signal $u_m$ of the FM-demodulator 5 is applied to a phase detector 9. This phase detector forms part of a phase locked loop (PLL) which further comprises an oscillator 10 which is controlled by phase detector 9 and is tuned to the subcarrier frequency of 38 kHz. Via a frequency divider 11 which divides the oscillator frequency by a factor 2, the output signal of the oscillator is applied to a second input of the phase detector 9. The phase detector 9 synchronizes in known manner the output frequency of oscillator 10 to the frequency of the pilot signal contained in the stereo multiplex signal $u_m$. A further output of oscillator 10 supplies a low-ohmic voltage $u_d$ which varies triangularly with time and which is applied to a further input of stereo decoder 6.

FIG. 2 shows an embodiment of the stereo decoder 6. This stereo decoder consists of a matrix circuit 60 to which the sum signal or the stereo-multiplex signal is applied and also the demodulated difference signal L-R or $-(L-R0)$. At its outputs it supplies the signals L and R for the amplifiers 7 and 8. A mixer circuit comprises two crosswise-coupled pairs of transistors, that is to say four bipolar npn-transistors 61, 62, 63 and 64, each of these transistors having one of its three electrodes in common with the corresponding electrodes of one of the three other transistors. The common emitter lead of the transistors 61 and 62 is connected to the collector of a transistor 65 whose emitter is connected to the emitter of a further transistor 66 via two series-arranged resistors 651 and 661 which are used for linearisation purposes, the collector of this transistor 66 being connected to the junction point between the emitters of the transistors 63 and 64. The junction of the two equally large resistors 651 and 661 is connected to ground via a direct current source 67. The stereo-multiplex signal, at least the difference signal contained therein and which is amplitude-modulated on the suppressed 38 kHz carrier is applied between the two base electrodes of the transistors 65 and 66, which form the first input 68 of the (balanced)-mixer circuit. As a result thereof the transistors 65 and 66 produce collector currents which comprise the same direct current component and equally large signal components, which are however at opposite phases.

Between the interconnected base electrodes of the transistors 61 and 64 on the one hand and of transistors 62 and 63 on the other hand, which form the second input 69 of the mixer circuit, the voltage $u_d$ which varies triangularly with time is applied, which voltage increases periodically and linearly with time from a lower voltage value to an upper voltage value to decrease thereafter again linearly and with a negative slope to the lower voltage value. This voltage $u_d$ has a frequency of 38 kHz.

By mixing them with the triangular signal $u_d$ the sidebands of the difference signal modulated on the suppressed 38 kHz carrier, which occur in the frequency range between 23 and 53 kHz, are converted to the range from 0 to 15 kHz, so that the collector currents produced by the two pairs of transistors (for which purpose the collector electrodes of the respective transistors 61 and 63 and 62 and 64 are interconnected) produce a signal component which corresponds to the difference signal L-R and -(L-R), respectively and from which the signals L and R are formed with the aid of the/sum signal in the linearly operating matrix circuit 60. When, in addition to the difference signal modulated on the 38 kHz carrier, the sum signal is applied to input 68, a signal which fluctuates around 38 kHz with the frequency of the sum signal is produced in the collector currents of the transistors 61 . . . 64, it being possible to remove this signal again by means of filtering at the output of the matrix circuit 60 and the amplifier connected thereto, respectively.

Although in this embodiment the alternating currents from all four transistors are evaluated, which offers the advantage that the direct voltages at the junction points between the respective transistors 61 and 63 and 62 and 64 are equal to each other and constant with time, it is alternatively possible to use the collector currents of only two transistors, for example the transistors 61 and 64, or alternatively on one signal transistor only.

As mentioned in the foregoing the triangularly shaped voltage at input 69 is converted by transistors 61 and 64 into collector currents which, at a suitable choice of the amplitude of the triangularly shaped voltage vary substantially sinusoidally- when it is assumed that the voltage $u_m$ is either signal to 0 volt or DC voltage. If it is assumed that the collector currents of transistors 61 . . . 64 depend exponentially on the voltage between bases and the emitters of these transistors, and if it is further assumed that the voltage drop generated by the collector currents of transistors 65 and 66 at the base or the emitter-path resistors of these transistors is low compared to the thermal voltage $u_T$ (26 mV), there occurs, as is known, a hyperbolic tangent relationship (as defined in the introduction) between the collector currents and the voltage $u_d$. The thermal voltage $u_T$ is the well known voltage KT/Q, wherein K is the Boltzman constant T is the absolute temperature and Q is the charge of an electron. As a result thereof the triangularly shaped voltage is distorted to a greater or lesser degree depending on its amplitude $\hat{u}_d$.

FIG. 3 shows the quotients $K_3$ and $K_5$, respectively which were calculated on the basis of the above assumptions, between the third and fifth harmonics, respectively on the one hand and the fundamental wave on the other hand (in a percentage figure) as a function of the amplitude $\hat{u}_d$ of the triangularly shaped voltage normalized to the thermal voltage $u_T$. From FIG. 3 it appears that $K_3$ and the third harmonic, respectively reach the value O when the amplitude of the triangularly shaped voltage approximately corresponds to three times the thermal voltage and that $K_5$ and the component of the fifth harmonic, respectively has a flat minimum at an amplitude which is slightly higher. If in correspondence therewith the amplitude of the triangularly shaped voltage is chosen such that it is approximately three times the amplitude of the thermal voltage, which at room temperature is the case at approximately 78 mV, the amplitude of the third harmonic is hardly greater than in the circuit in accordance with the German Patent Application No. 25 13 228 which has been laid open to public inspection, while the component $K_5$ of the fifth harmonic is considerably lower and is even less than 2%. Measurements in practical circuits have confirmed these calculations. If, however, the voltage across the base and the emitter resistors are no longer so small as to be disregarded relative to the thermal voltage $U_T$, the minima for $K_3$ and $K_5$ shift however to higher values of the triangularly shaped voltage. In practice, the optimum amplitude of $u_d$ should therefore be obtained by means of measurements.

In the circuit shown in FIG. 2 the mixer circuit functions as a pure demodulation circuit which causes the signal which was amplitude-modulated on the suppressed 38 kHz carrier to appear demodulated at the collector of the transistors 61 ... 64. Any low frequency sum signal components in the signal at the input 68 are converted by the triangularly shaped voltage to two sidebands on either side of 38 kHz, but do not affect the reception. Consequently a matrix circuit 60 is required which mixes the mixer circuit output signals which correspond to the difference signals L−R and −(L−R), respectively with the sum signal (L+R). When the signal current component of the currents produced by the transistors 65 and 66 is proportional to the multiplex signal $u_m$ and when from the collector alternating currents of the transistors 61 and 63 on the one hand, and 62 and 64 on the other hand an alternating current is subtracted (for example by applying a corresponding current of opposite phase) which current is half as large as the signal current component, the matrix circuit may be of a comparatively simple construction. It then only comprises two equally large resistors each one of which is connected to the common collector junction points of the transistors 61, 63 and 62, 64, respectively, the other terminal of these resistors being connected to the positive supply voltage FIG. 4 shows a mixer circuit which no longer requires the subsequent matrix circuit, but which produced at its outputs directly the respective signals L and R for the left and right channel, respectively. This mixer circuit also consists of two crosswise-coupled pairs of transistors-consisting of the transistors 61 ... 64, whose pairwise interconnected base electrodes (transistors 61 and 64 and also 62 and 63) again form the second input 69 to which the voltage $u_d$, which varies triangularly with time is applied. The common emitter lead of the transistors 61 and 62 incorporates a current source 612 which supplies a direct current $I_O$ and contains an alternating current component $i_m$ which is obtained in a manner not further shown from the FM-demodulator output signal and which alternating current component is proportional to the stereo multiplex signal $u_m$. The common emitter lead of the transistors 63 and 64 also incorporates a current source 634 which produces the same direct current component $I_O$ as the current source 612, but which includes an alternating current component aim which is a factor a smaller than the alternating current component produced by the source 612 and of opposite phase thereto. Via a resistor 613 the collector electrodes of the transistors 61 and 63 are connected to a positive supply voltage and also the collector electrodes of the transistors 62 and 64 are connected to the supply voltage via an equally large resistor 624.

If the triangularly shaped voltage $u_d$ has a defined value which is located between 60 mV and 150 mV, substantially no alternating current components whose frequencies amount to three times and five times, respectively the frequency of the triangularly shaped signal are produced in the collector currents, as was already explained with reference to FIG. 2 and FIG. 3. If, in addition, the factor a is approximately $\frac{1}{3}$, the signals L and R for the left and right channel, respectively are produced directly at the collector resistors 613 and 624. A matrix circuit is then no longer required.

Figure 5:
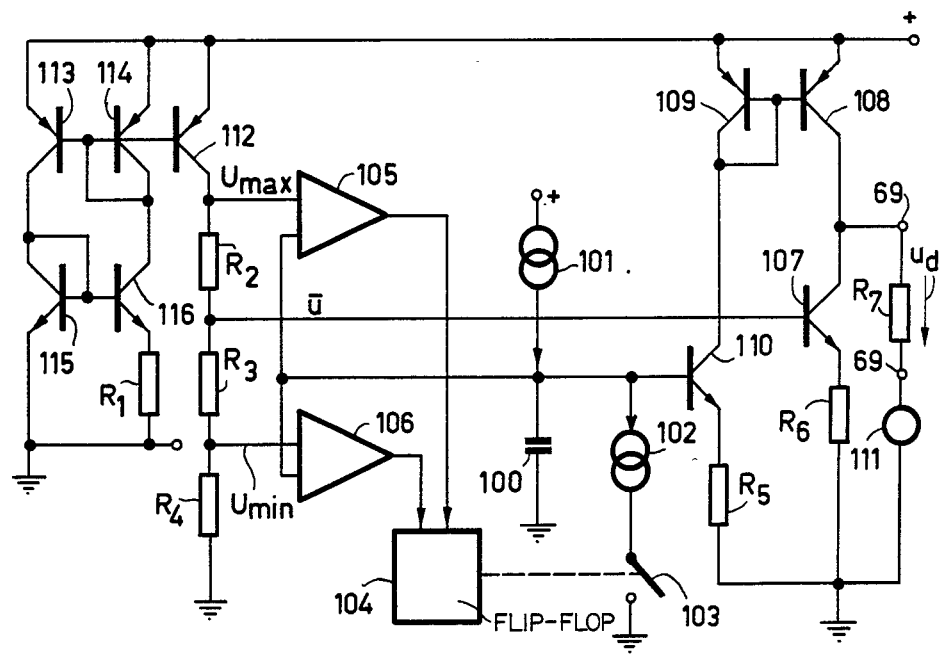
FIG. 5 shows a preferred embodiment of the circuit for generating the triangularly shaped voltage.

Since, as shown in FIG. 3, the amplitude $\hat{u}_d$, at which the third and fifth harmonics are minimal, is proportional to the thermal voltage $u_T$, they vary, as does the thermal voltage, proportionally varies to the temperature. For a circuit which is exposed to fluctuating temperatures, the amplitude of the triangularly shaped voltage should consequently be changed proportional to the temperature when the interference factor is to be minimized at all times. FIG. 5 shows a triangularly shaped voltage generating device which ensures this. Such a circuit may be an essential component part of the voltage-controlled oscillator 10 denoted in FIG. 1.

The voltage generator comprises a capacitor 100 which can be charged by a current source 101 and discharged by a current source 102. By means of a switch 103 the discharge current source 102 can be switched on and off. When the switch 103 is open, the capacitor 100 is charged linearly by the current source 101. When switch 103 is closed, capacitor 100 is charged by current source 101 and discharged by current source 102. As source 101 and discharged by current source 102. As current source 102 has been rated such that its current is exactly twice the current of the current source 101, a discharge current is produced which is of the same magnitude as the charge current produced by the current source 101 alone. Switch 103 is opened and closed at a rate of 38 kHz. Opening and closing is effected by means of a flip-flop circuit 104 which itself is controlled by a comparison device comprising two comparators 105 and 106. The capacitor voltage is applied to one input of the two comparators 105 and 106, while a direct voltage which represents the upper limit value $U_{max}$ of the capacitor voltage is connected to the other input of the comparator 105 and a direct voltage representing the lower limit value $U_{min}$ is connected to the other input of the comparator 106.

As soon as (switch 103 being open) the current source 101 has charged the capacitor 100 to such an extent that the upper limit value $U_{max}$ is reached, the comparator 105 generates a signal which causes the flip-flop circuit 104 to change state and thereby to close the switch 103. This results in the capacitor 102 being discharged until the lower limit value $U_{min}$ is reached and the comparator 106 is energized and the flip-flop circuit 104 changes state again which causes the switch 103 to open again, the capacitor 100 is charged again etc.

The upper and the lower limit values $U_{max}$ and $U_{min}$, respectively are produced by means of three series-arranged $R_2$, $R_3$, $R_4$ through which the collector direct current from a pnp transistor 112 flows, the collector-emitter path of this transistor being connected between the positive supply voltage and the input of the comparison device 105, which device produces the upper limit value $U_{max}$. The series arrangement of the two resistors $R_2$ and $R_3$ is arranged between said input and the corresponding input of the comparison device 106, while the resistor $R_4$ is provided between the said input of the comparison device 106 and ground. The resistors $R_2$ and $R_3$ have equal values, so that the voltage U at the junction point thereof is accurately in the center between the upper and the lower limit values. This voltage is applied to the base of a PNP-transistor 107, the emitter of which is connected to ground via a resistor $R_6$. The collector of the transistor 107 is connected to the collector of an NPN transistor 108 those emitter is connected to the positive supply voltage and which forms a current mirror in conjunction with a transistor 109 which is connected as a diode. This NPN-transistor 109 is connected to the collector of a PNP-transistor 110, to whose base the voltage from capacitor 100 is applied and whose emitter is connected to ground via a resistor $R_5$. The junction between the transistors 108 and 107 is connected to a direct voltage source 111 via a resistor $R_7$, which may have a value of not more than some hundreds of Ohms.

The transistor 107 produces a constant direct current while the transistor 110 and consequently also the current mirror 108, 109 produce a triangular alternating current whose average value has been chosen such that by means of a suitable rating of the resistors $R_5$ and $R_6$ and of the emitter surface areas of the current mirror transistors 108 and 109 it corresponds to the direct current produced by the transistor 107. The difference between the triangularly shaped alternating current produced by transistor 108 and the direct current produced by the transistor 107 flows with alternating polarity through the resistor $R_7$ to the voltage source 111 and generates at the resistor $R_7$ a voltage $u_d$ which varies triangularly with time and whose amplitude is proportional to the magnitude of the resistor $R_7$ and whose average value with respect to time is determined by the magnitude of the direct voltage produced by the direct voltage source 111. Consequently, the second input 69 of the mixer circuit shown in FIG. 2 and FIG. 4, respectively may be connected to the resistor $R_7$.

The direct current produced by the transistor 112 and flowing through the resistors $R_2 \ldots R_4$ is determined by a current mirror formed by two PNP transistors 113 and 114, whose base-emitter paths are in parallel with the base-emitter path of the transistor 112, one of these transistors being connected as a diode by connecting its base to its collector. Another current mirror formed by NPN-transistors 115 and 116 is provided in the collector branch of these transistors 113 and 114, the collector of the transistor 115, which is connected as a diode being connected to the collector of the transistor 113 and the collector of the transistor 114 which is connected as a diode being connected to the collector of the transistor 116 whose emitter surface area is k-times the emitter surface area of the transistor 115, a resistor $R_1$ being incorporated in its emitter lead. The circuit 113 ... 116 which is known per se causes the current generated by this circuit and consequently the collector current generated by the transistor 112 to be proportional to the quotient of the thermal voltage and the resistance $R_1$. This achieves that:

(a) the limit value $U_{min}$ and $U_{max}$ change in proportion with the temperature. The same applies to the difference between these values and consequently ultimately to the amplitude of the voltage $u_d$ at the resistor $R_7$. A suitable rating may achieved that, also at fluctuating temperatures the voltage $u_d$ has always the amplitude which is required to achieve the noise factor minimum. It is a condition that the transistors 113 and 116 and also the transistors 61 to 64 (FIGS. 2 to 4) are exposed to the same temperatures, which is ensured in the most reliable manner by providing the circuit shown in FIG. 5 and in FIG. 4 or FIG. 2 in the form of an integrated circuit on a common substrate.

(b) since the current produced by the transistor 112 is substantially proportional to the resistance $R_1$ and the limit values $U_{max}$ and $U_{min}$, respectively are directly proportional to the resistors $R_2$ and $R_4$ the upper and the lower limit values $U_{max}$ and $U_{min}$ are independent of the production method required for manufacture in integrated techniques, it being possible that the resistance values $R_1 \ldots R_4$ may vary considerably, however always to the same extent. Consequently, the amplitude of the voltage at the resistor $R_7$ is also independent to a very high extent of differences in these production methods.

What is claimed is:

1. In apparatus for demodulating a first signal having a predetermined carrier frequency, said apparatus comprising mixing means having a mixer output and first and second mixer inputs, means for creating a linear transfer function between said mixer output and said first input and an at least approximately hyperbolic tangent transfer function between said mixer output and said second input, and wherein undesired third and fifth harmonics of said carrier frequency appear at said mixer output, the improvement comprising:

means for generating a symmetrical triangular signal having a frequency corresponding to said carrier frequency and applying said triangular signal to said second mixer input, said second triangular signal having an amplitude adapted to minimize said third and fifth harmonics at said mixer output.

2. Apparatus as set forth in claim 1, wherein said mixing means comprises a pair of transistors each having an emitter, a collector and a base, and a current source connected to said emitters and furnishing an ac current varying in correspondence to said first signal; and wherein said triangular signal is applied to said base of at least one of said transistors.

3. Apparatus as set forth in claim 1, wherein said triangular signal has an amplitude of between 60 mV and 150 mV.

4. Apparatus as set forth in claim 1, wherein said mixing means comprises a first and second pair of transistors each pair having a first and second emitter, collector and base, a first current source connected to said emitters of said first pair, a second current source connected to said emitters of said second pair, said first current source furnishing a first ac current varying in dependence on said first signal and a first dc current, said second current source furnishing a second direct current equal to said first direct current and a second ac current varying in accordance with said first signal.

5. Apparatus as set forth in claim 4, wherein said first signal is a stereo difference signal and said carrier frequency is the subcarrier frequency thereof; and wherein said first and second alternating currents have the same amplitude but opposite phase.

6. Apparatus as set forth in claim 4, wherein said first signal is a stereo difference signal and said carrier frequency is the subcarrier frequency thereof; and wherein said first and second alternating currents have the same phase but different amplitudes.

7. Apparatus as set forth in claim 1, wherein said triangular signal generator means comprises a first and second constant current source for, respectively, charging and discharging said capacitor, thereby creating an increasing and decreasing capacitor voltage, means generating an upper and lower limit value signal, comparator means for comparing said capacitor voltage to said upper and lower limit value signals and initiating charging of said capacitor when said capacitor voltage reaches said lower limit value and discharging said capacitor when said capacitor voltage reaches said upper limit value.

8. Apparatus as set forth in claim 7, further comprising means for changing said upper and lower limit values as a function of ambient temperature.

* * * * *